United States Patent [19]

Williams et al.

[11] 3,798,471

[45] Mar. 19, 1974

[54] SWITCH DRIVER

[75] Inventors: Heyward Sturges Williams, Amherst; Robert Robbins, Hudson, both of N.H.

[73] Assignee: LRC, Inc., Hudson, N.H.

[22] Filed: Aug. 9, 1972

[21] Appl. No.: 279,258

[52] U.S. Cl. .................. 307/255, 307/270, 307/235

[51] Int. Cl. .......................................... H03k 17/00

[58] Field of Search .......... 307/255, 313, 254, 270, 307/235, 256; 330/15, 18

[56] References Cited

UNITED STATES PATENTS

| | | | |
|---|---|---|---|
| 3,303,380 | 2/1967 | Kozikowski | 307/270 X |
| 3,649,851 | 3/1972 | Cohen | 307/270 |
| 2,943,266 | 6/1960 | Belland | 330/15 |
| 3,130,326 | 4/1964 | Habishohn | 307/255 |

OTHER PUBLICATIONS

IBM Tech. Disclre. Buttln. Non Shorting Complementary Switch by Erdman, Vol. 5, No. 11, 4/63.

*Primary Examiner*—Rudolph V. Rolinec
*Assistant Examiner*—B. P. Davis

[57] ABSTRACT

An impedance sensitive switch driver circuit for providing an output which is approximately symmetrical about a reference voltage level in response to an input signal which swings between a first state in which the input source provides a first voltage level and appears as a lower impedance and a second state in which the input source provides a second voltage level and appears as a higher impedance including: an input terminal; an output terminal; a voltage divider circuit having a first power terminal and a second power terminal, and including a first impedance having one end connected to the first power terminal and the other end connected to the input terminal for producing in the second state at the input terminal a voltage approximately equal to the second voltage level, a second impedance having one end connected to the input terminal and the other end connected to a switching terminal for producing a voltage difference between the input terminal and the switching terminal, and a third impedance having one end connected to the switching terminal and the other end connected to the second power terminal for minimizing the change in current through the second impedance between the first and second state; a semiconductor circuit including a first semiconductor having a first load electrode connected to the output terminal, a second load electrode connected to a third power terminal, and a control electrode connected to the switching terminal for turning on the first semiconductor during one of the states and a second semiconductor having a first load electrode connected to the output terminal, a second load electrode connected to a fourth power terminal, and a control electrode connected to the switching terminal for turning on the second semiconductor during the other of said states.

22 Claims, 3 Drawing Figures

SWITCH DRIVER

FIELD OF INVENTION

This invention relates to an impedance sensitive switch driver circuit and more particularly to such a switch driver circuit for producing an approximately symmetrical output.

BACKGROUND OF INVENTION

In some applications it is desirable to have a switch driver which produces a balanced or symmetrical output i.e., an output which swings as far in one direction as it does in the other from some reference level. For example, in microwave applications it is often desirable to provide switching signals which switch from 1 or 2 volts positive to 1 or 2 volts negative symmetrically about zero or ground. Also in switching applications it is desirable to minimize delay between the output and the input and to prevent accidental triggering of the circuits by noise or spurious signals at the input.

SUMMARY OF INVENTION

It is therefore an object of this invention to provide a simple, inexpensive switch driver circuit which produces an output symmetrical or approximately symmetrical about a reference level.

It is a further object of this invention to provide such a switch driver circuit in which the switching action occurs in response to a change in impedance at the input so that weak signals coming from the proper input source will nevertheless cause the circuit to switch even if the signal voltage is low, whereas noise signals not accompanied by a change in impedance at the input will not.

It is a further object of this invention to provide such a switch driver circuit in which the switching time may approach zero since the switching action, thus the output signal, may begin as soon as the impedance changes and not be delayed by the time it takes for the input voltage to reach some predetermined level.

The invention features an impedance sensitive switch driver circuit for providing an output which is approximately symmetrical about a reference voltage level in response to an input signal which swings between a first state in which the input source provides a first voltage level and appears as a lower impedance and a second state in which the input source provides a second voltage level and appears as a higher impedance. The switch driver circuit includes an input terminal, an output terminal and a voltage divider. The voltage divider has a first power terminal and a second power terminal and includes a first impedance having one end connected to the first power terminal and the other end connected to the input terminal for producing in the second state at the input terminal a voltage approximately equal to the second voltage level. A second impedance has one end connected to the input terminal and the other end connected to a switching terminal for producing a voltage difference between the input terminal and the switching terminal. A third impedance has one end connected to the switching terminal and the other end connected to the second power terminal for minimizing the change in current through the second impedance between the first and second states. There is also a semiconductor circuit including a first semiconductor having a first load electrode connected to the output terminal, a second load electrode connected to the third power terminal and a control electrode connected to the switching terminal for turning on the first semiconductor during one of the states. A second semiconductor has a first load electrode connected to a fourth power terminal and a control electrode connected to the switching terminal for turning on the second semiconductor during the other of the states.

DISCLOSURE OF PREFERRED EMBODIMENT

Other objects, features and advantages will occur from the following description of a preferred embodiment and the accompanying drawings, in which.

Figure 1:
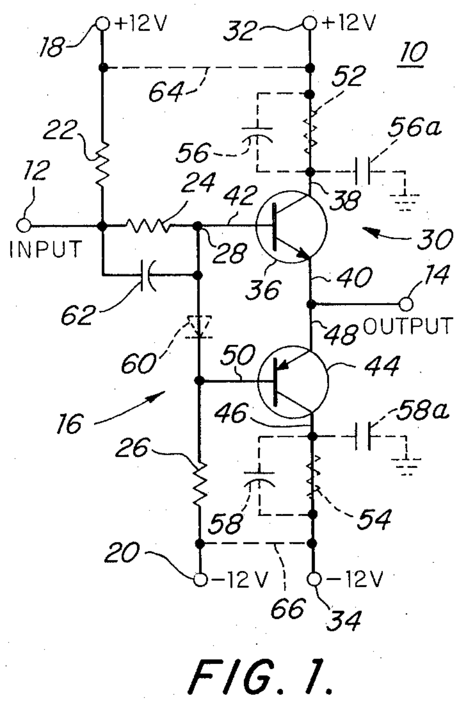
FIG. 1 is a schematic diagram of a switch driver circuit according to this invention.

In one embodiment, FIG. 1, switch driver 10 includes an input terminal 12 and an output terminal 14. A voltage divider 16 extends between a first power terminal 18 and a second power terminal 20 and includes three impedances, resistors 22, 24 and 26. Resistor 22 is connected between power terminal 18 and input terminal 12; resistor 24 is connected between input terminal 12 and switching terminal 28; resistor 26 is connected between the second power terminal 20 and switching terminal 28.

A semiconductor circuit 30 connected between a third power terminal 32 and fourth power terminal 34 includes an NPN transistor 36 having its collector 38 connected directly to power input terminal 32 and an emitter 40 connected directly to output terminal 14. The base 42 of transistor 36 is connected directly to switching terminal 28. A second PNP transistor 44 has its collector 46 connected directly to power terminal 34, its emitter 48 connected directly to output terminal 14, and its base 50 connected directly to switching terminal 28. Collector 38 may be connected to power terminal 32 through a limiting resistor 52, shown in phantom, to limit the amount of current flowing through transistor 36 to output 14. Similarly collector 46 of transistor 44 may be connected to power terminal 34 through a limiting resistor 54. A capacitor 56, shown in phantom, may be connected in parallel with limiting resistor 52 to speed up the delivery of current to output terminal 14 when transistor 36 is turned on. Alternatively, a capacitor **56*a* may be connected with one end to collector 38 and the other end to ground for the same purpose. Similarly a capacitor 58 or capacitor 58*a* may be connected to collector 46 of transistor 44. If temperature compensation is desirable in the circuit a diode 60 may be inserted between base 42 and base 50 so that base 50 and resistor 26 are no longer directly connected to switching terminal 28 but are connected to it through diode 60. The junction resistance of diode 60 is such that the voltage drop across it is approximately 0.6 volt which is the same as that across the emitter - base junction of either transistor 36 or 44. A capacitor 62 may be placed in parallel with resistor 24** to speed up the transfer of voltage to switching terminal 28 to improve the switching time of the circuit.

In one specific example where the input signal has states of zero volts (0) and plus five volts (+5) power terminals 18 and 32 are each connected to a positive 12 volt source and power terminals 20 and 34 are each connected to a minus 12 volt source. Then resistor 22 may be 1,000 ohms; resistor 24, 560 ohms, resistor 26, 2,200 ohms and capacitor 62 may be from 700 to 1,200 pf. Transistor 36 may be an NPN 2N3014 and transistor 44 may be a PNP 2N4209 and diode 60 may be a 1N4148. Limiting resistors 52 and 54 may be 330 ohms and capacitors 56 and 58 could be from 700 to 1200 pf.

In operation when zero volts is applied to input terminal 12 there is essentially a ground connected to input terminal 12 which decreases the impedance at the terminal to approximately zero, typically no more than 10 or 20 ohms. The drop across resistor 24 is then approximately 2 volts so that switching terminal 28 is at approximately −2.0 volts. Considering the 0.6 volt drop through diode 60 base 50 will be at approximately −2.6 volts. Since this places base 50 at a considerably more negative level than emitter 48, transistor 44 turns on and conducts current from a load connected to output terminal 14 through transistor 44 to the voltage source connected to power terminal 34. At this point, considering a high impedance load at output terminal 14, the voltage at emitter 48 is −2.0 volts. This voltage appears on output 14 and emitter 40 as well as emitter 48. Thus base 42 is more negative than emitter 40 and transistor 30 is prevented from conducting while transistor 44 is conducting. Subsequently, when the signal at input 12 changes from 0 to +5 volts the impedance at input terminal 12 quickly changes from a very low or even short circuit condition to a very high impedance in the neighborhood of 100,000 to 300,000 ohms or more. This permits a voltage drop of 7 volts across resistor 22 to raise input terminal 12 to the normal condition of +5 volts; the voltage drop across resistor 24 is now slightly larger than it was when the input signal was at zero volts i.e., the drop is now 2½ volts so that switching terminal 28 is at a level of 2½ volts less than the +5 volts at input terminal 12 or +2.5 volts. This difference in voltage drop across resistor 24 from the state where the input signal is at 0 to the state where the input signal is at +5 volts, is not desirable but it is tolerable. It occurs because when the input signal is zero the voltage drop across resistor 24, diode 60, and resistor 26 is a total of 12 volts: there is zero volts at input terminal 12 and −12 volts at power terminal 20. In the other state where the input signal is at +5 volts there is a total of 17 volts across resistor 24, diode 60, and resistor 26 i.e., from the +5 volts at input terminal 12 to the −12 volts at power terminal 20. Thus at switching terminal 28 the voltage is now +2.5 volts which means that at base 50 the voltage will be at +1.9 volts. With +1.9 volts at base 50, base 50 becomes more positive than emitter 48 and transistor 44 is turned off. However, with base 42 at +2.5 volts base 42 is more positive than emitter 40 and transistor 36 turns on driving the voltage at output 14 to a positive level of +2.0 volts.

The switching of circuit 10 effectively occurs in response to a change in impedance of the input source connected to input terminal 12. Input terminal 12 is held at +5 volts by the +12 volts at power terminal 18 through the seven volt drop in resistor 22. Thus when there is a high impedance or an open circuit at input terminal 12, input terminal 12 remains at +5 volts. However, when a short circuit or very low impedance is connected to input terminal 12, effectively grounding input terminal 12 then input terminal 12 goes to zero volts. Thus circuit 10 can be switched by applying short circuits and open circuits to input terminal. Since this is so a wide variation in the voltage level of the input signals can be tolerated without interfering with the switching action of circuit 10 as long as there occurs the change in impedance which accompanies the voltage change. In addition, noise rejection is good because circuit 10 does not respond to spurious signals which fail to reflect changes in impedance at input terminal 12. Further, the speed of circuit 10 is exceptionally good because the current can begin to switch as soon as the impedance changes and need not wait on the voltage reaching some predetermined level. Since the impedance can change instantaneously the output can be made to occur nearly simultaneous with the input providing zero delay.

The value of resistor 24 is chosen to provide a voltage drop across resistor 24 appearing at switching terminal 28 which is equivalent to one half of the difference between the two input levels. Since the input levels are zero and five the drop across resistor 24 should be 2.5 volts; this is done in order to make the voltage variation symmetrical about the reference level, which in this case is ground or zero volts. This can be seen by the fact that with +5 volts appearing at input terminal 12 the 2.5 volt drop across resistor 24 provides a +2.5 volt level at switching terminal 28. In practice the symmetry is only approximate because on the negative swing −2.5 volts is not reached rather only − 2.0 volts is reached. This is so because as explained previously there are seventeen volts across resistor 24, diode 60 and resistor 26 when there is a +5 volt input but only 12 volts across those three elements when there is a zero volt input. This deviation is minimized by increasing the resistance value of resistor 26 so that it becomes realtively much greater than that of resistor 24 so that the change in current through resistor 24 will be minimized. However, by increasing resistor 26 the amount of current through resistor 24 is necessarily decreased also and this changes the reference voltage around which the voltage swing at output terminal 14 is symmetrical. Thus if resistor 26 was made twice as large as it is the current through resistor 24 would be half as large and so the voltage swing instead of being from +2.5 to −2 would be of greater magnitude but would swing from +3.75 volts to −1.25 volts. Conversely, decreasing resistance of resistor 26 will decrease the magnitude of the voltage swing in each direction and will change the reference about which the output voltage is symmetrical.

If symmetry of the output current limits is not desired or if it is undesirable resistors 52 and 54 may be independently varied to vary the current through transistor 36 and 44 and thus provide one magnitude of output current when transistor 36 is conducting and a different magnitude of output current when transistor 44 is conducting. For the specific example shown in FIG. 1 where power terminals 18 and 32 are connected to voltage sources of the same polarity and the same magnitude they may be connected together as shown by dashed line 64. Similarly power terminals 20 and 34 may be connected together as shown by dashed line 66. If it is desired to provide an input of zero and −5 volts instead of zero and +5 volts, circuit 10 may be modified by interchanging transistors 30 and 44 and connecting power terminal 32 to a negative 12 volt source and power terminal 34 to a positive 12 volt source. In that case connections 64 and 66 would not be made.

The reference level about which symmetry occurs is not limited to zero volts or ground, it may be any other voltage as desired. For example, if the desired output swing was 0 to −4 volts, symmetrical about −2, the resistors 24, 26 would be revalued to produce the proper bias at switching terminal 28 to produce 0 and −4 volts at the output 14. Or, if the desired swing was from +5 volts to +8 volts i.e., symmetrical about +6.5 volts power terminal 18 would be connected to −12 volts, power terminal 20 would be connected to +12 volts, and reisstors 22, 24 and 26 would be revalued in order to provide the required voltage swing at switching terminal 28. That is, the voltage drop across resistor 24 should be approximately 4.5 volts when the input signal is at zero to produce a 4.5 volts bias at switching terminal 28 and approximately 3.5 volts when the input signal is at +5 volts to produce 8.5 volts at switching terminal 28. In addition when diode 60 is used its connections and those of bases 42 and 50 would also have to be interchanged. Although circuit 10 has been shown using a complementary arrangement of a PNP transistor and on NPN transistor, this is not a limitation of the invention. For other semiconductors such as FET's and the like may be used in place of such transistors with suitable accommodation in the rest of the circuit. The load terminals of such semiconductor devices correspond to the collectors and emitters of the transistors shown and the control electrode of such semiconductors correspond to the bases of the transistor shown.

Although the supply voltages in FIG. 1 are shown to be +12 volts and −12 volts this too is not a limitation of the invention; for example the voltages can be higher or lower. However, as the voltages go lower, i.e., as they approach the signal input voltages, the difference between the two levels of input voltages becomes larger and larger relative to the power supply voltages. Thus, for example, in FIG. 1, if the power supply voltages were −5 volts and +5 volts numerous problems would occur. For example, if the negative power supply voltage is −5 volts at power terminals 20 and 34 then the total drop across resistor 24, diode 60 and resistor 26 when the input was at zero would be 5 volts. However the total drop across those same elements when the input went to the +5 volt stage would be 10 volts i.e., from +5 volts to −5 volts. This means that the current through resistor 24 in the +5 volt state is twice that in the zero volt state. Increasing the resistance of resistor 26 does not solve the problem because the voltage through resistor 24 will still change by a factor of two. Thus as the power supply voltage at power terminals 20 and 34 moves closer and closer to the signal voltage the magnitude of the output signal will become smaller and smaller. A second problem associated with a decrease in power supply voltage occurs when the positive power supply voltage at power terminals 18 and 32 is decreased. For example, when power terminals 18 and 32 are connected to a +5 volt source, and considering that the input signal is at zero volts, the resistor 22 performs as usual. That is, the drop across resistor 22 is the full power supply voltage i.e., 5 volts and current flows through resistor 22 out through input terminal 12 to the low impedance connected to input terminal 12. However, when the input signal switches to +5 volts there is a +5 volt signal at input terminal 12 which is equal to the +5 volt power supply voltage at the other end of resistor 22. Thus no current flows through resistor 22 and there is no current supplied to resistor 24 and resistor 26 and the circuit is inoperative.

Figure 2:
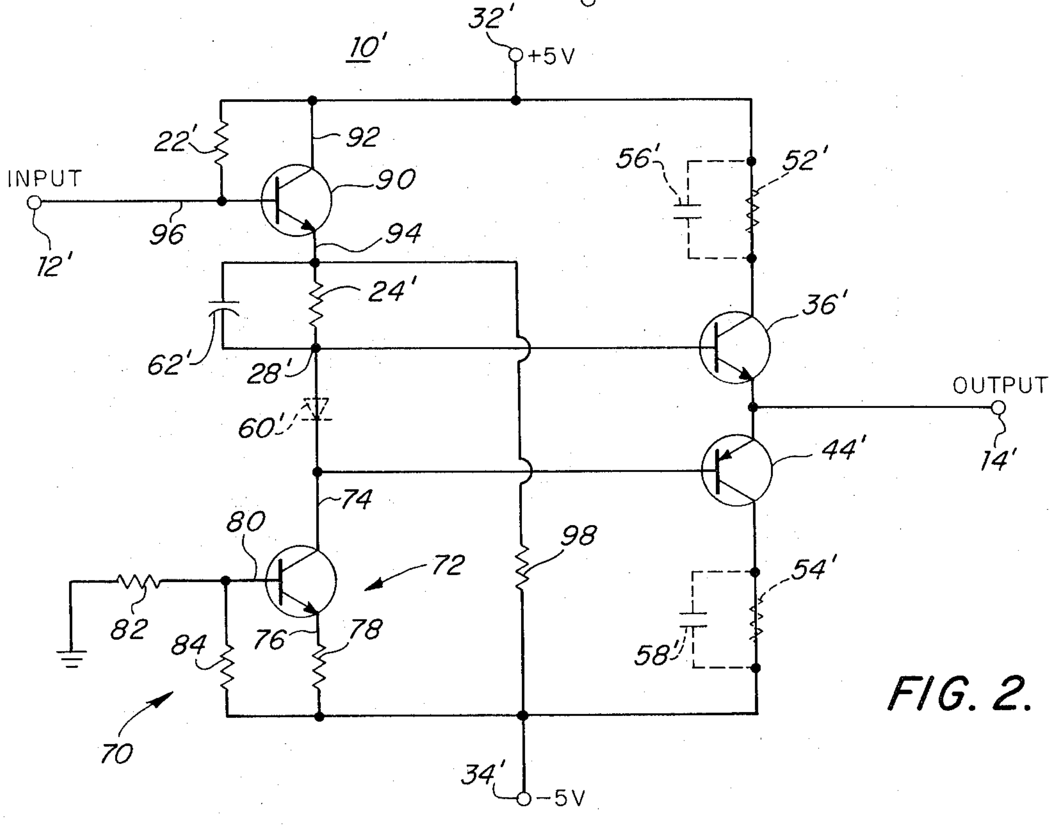
FIG. 2 is a schematic diagram of a switch driver circuit according to this invention for operating at lower power supply voltages.

A solution for these two problems is shown in the switch driver circuit 10′ in FIG. 2 where similar parts have been given like numbers primed. To maintain a constant current through resistor 24′ even though the voltage from input terminal 12′ to power terminal 34′ may double, a current generator 70 is used in place of resistor 26. Current generator 70 includes a 2N3014 NPN transistor 72 having its collector 74 connected to switching terminal 28′ and an emitter 76 connected to power terminal 34′ through resistor 78 which may typically be a 110 ohm resistor. The base 80 of transistor 72 is biased for conduction by means of a 300 ohm resistor 82 connected to ground and a 240 ohm resistor 84 connected connected from the base to the power terminal 34′ The use of current generator 70 in place of resistor 26 ensures that the current through resistor 24′ will remain constant even though the voltage between input terminal 12′ and power terminal 34′ may change by a factor of two as explained previously. There is an additional advantage in using a current generator 70: previously resistor 24′ had to be carefully tailored to provide the needed symmetry i.e., a voltage drop equal to one half the difference of the input levels but was constrained by the additional fact that it could not become too large with respect to resistor 26 or the current through resistor 24′ would no longer be essentially constant or approximately constant. However, since current generator 70 maintains a constant current through resistor 24′, resistor 24′ may now be optimized to produce the maximum allowable swing at switching terminal 28′. Thus for a zero to +5 volt input signal resistor 24′ may be optimized to produce a 2.5 volt drop across it so that switching terminal 28′ swings from +2.5 to −2.5 and follows the full 5 volt swing which appears at the input terminal.

The second problem is solved by providing a buffer semiconductor such as a 2N3014 NPN transistor 90 having its collector 92 connected to power terminal 32′, its emitter 94 connected to resistor 24′ and its base 96 connected to input terminal 12′. Since transistor 90 is an NPN transistor it will conduct if base 96 is more positive than emitter 94. In circuit 10′ this condition exists whether the input terminal 12′ is receiving the zero volt level or the +5 volt level so that transistor 90 is conducting to some extent all the time. Thus when there is a zero volt signal at input terminal 12′ transistor 90 conducts to a lesser degree and current flows from power terminal 34′ through resistor 22′ to the lower impedance input source appearing at input terminal 12′. When the signal at input terminal 12′ swings to the high impedance state, resistor 22′ pulls the base 96 of transistor 90 to +5 volts and simultaneously drives transistor 90 to conduct more heavily and supply the needed current to resistor 24′ from power terminal 32′. Thus the use of current generator 70 enables power terminal 34′ to be connected to a power supply as low as −5 volts and the use of transistor 90 permits the power terminal 32' to be connected to a power supply having a voltage as low as +5 volts. In this manner the switch driver circuit of this invention may be made to operate at power supply voltages close to or at the signal input voltages. Resistor 98 serves as a path for excess current through emitter 94.

Figure 3:
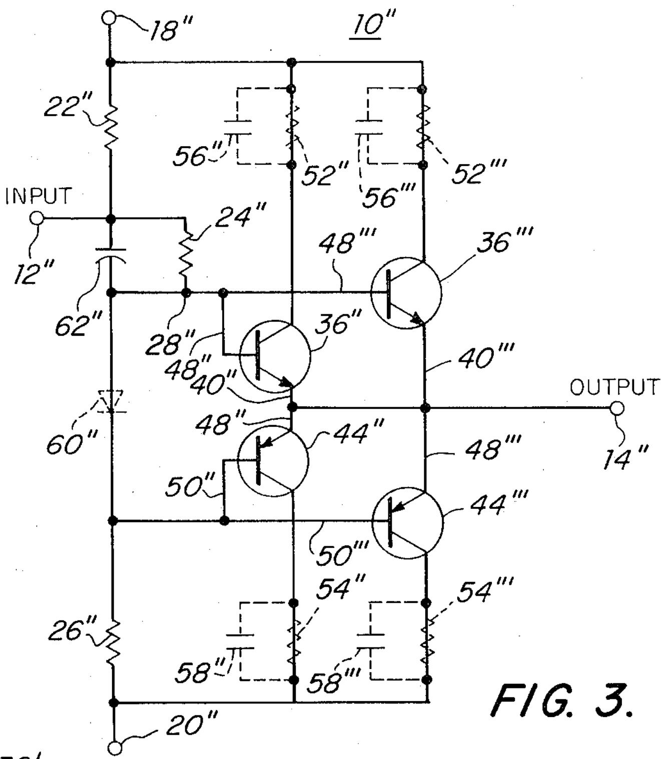
FIG. 3 is a schematic diagram of a switch driver circuit according to this invention which includes a partial duplication of the circuit shown in FIG. 1 to increase the power output of the circuit without decreasing the response time.

Switch driver circuit 10, FIG. 1, may be made to produce higher power outputs while maintaining an equivalent speed of operation by using more than one semiconductor circuit 30 connected in parallel as shown in FIG. 3 where like parts have been given like numbers double primed and triple primed with respect to FIG. 1.

Other embodiments will occur to those skilled in the art and are within the following claims:

What is claimed is:

1. An impedance sensitive switch driver circuit for providing an output which is approximately symmetrical about a reference voltage level in response to an input signal which swings between a first state in which the input source provides a first voltage level and appears as a lower impedance and a second state in which the input source provides a second voltage level and appears as a higher impedance comprising:

an input terminal for connection to an input source;

an output terminal;

a voltage divider circuit having a first power terminal and a second power terminal, and including a first impedance having one end connected to said first power terminal and the other end connected to said input terminal for providing in said second state at said input terminal a voltage approximately equal to said second voltage level, a second impedance having one end connected to said input terminal and the other end connected to a switching terminal for providing a voltage difference between said input terminal and said switching terminal, and a third impedance having one end connected to said switching terminal and the other end connected to said second power terminal for minimizing the change in current through said second impedance between said first and second states;

a semiconductor circuit including a first semiconductor having a first load electrode connected to said output terminal, a second load electrode connected to a third power terminal, and a control electrode connected to said switching terminal for turning on said first semiconductor during one of said states, and a second semiconductor having a first load electrode connected to said output terminal, a second load electrode connected to a fourth power terminal and a control electrode connected to said switching terminal for turning on said second semiconductor during the other of said states.

2. The switch driver circuit of claim 1 in which said control electrode of said first semiconductor is connected directly to said switching terminal and said control electrode of said second semiconductor and said third impedance are connected to said switching terminal through a diode.

3. The switch driver circuit of claim 2 in which said diode has a junction resistance equivalent to that between a said control electrode and a said first load electrode of a said semiconductor for providing temperature compensation.

4. The switch driver circuit of claim 1 in which said second load electrode of said first semiconductor is connected to said third power terminal through a first limiting impedance and said second load electrode of said second semiconductor is connected to said fourth power terminal through a second limiting impedance.

5. The switch driver circuit of claim 1 further including a first capacitor connected to said second load electrode of said first semiconductor and a second capacitor connected to said second load electrode of said second semiconductor for increasing the speed of the associated semiconductor in supplying power to the output terminal when that semiconductor is turned on.

6. The switch driver circuit of claim 5 in which said first and second capacitors are connected in parallel with said first and second limiting impedances, respectively.

7. The switch driver circuit of claim 1 in which said first semiconductor is an NPN transistor, said second semiconductor is a PNP transistor, said first electrodes are emitters, said second electrodes are collectors and said control electrodes are bases.

8. The switch driver circuit of claim 1 further including a capacitor connected in parallel with said second impedance for increasing the speed with which a signal at said input terminal can be applied to said control electrodes.

9. The switch driver circuit of claim 1 in which said first and second power terminals are connected to voltage sources of opposite polarities and said third and fourth power terminals are connected to voltage sources of opposite polarities.

10. The switch driver circuit of claim 9 in which said first and third power terminals are connected to voltage sources of like polarity and said second and fourth power terminals are connected to voltage sources of like polarity but opposite to that to which said first and third power terminals are connected.

11. The switch driver circuit of claim 9 in which said first and third power terminals are connected to voltage sources of the same voltage and said second and fourth power terminals are connected to voltage sources of the same voltage.

12. The switch driver circuit of claim 1 in which said third impedance includes a constant current source.

13. The switch driver circuit of claim 12 in which said constant current source includes a third semiconductor having a first load electrode, a second load electrode connected to said switching terminal, and a control electrode connected to a biasing network for biasing said third semiconductor to conduct, and a third limiting impedance having one end connected to said second load electrode of said third semiconductor and the other end connected to said second power terminal.

14. The switch driver circuit of claim 13 in which said biasing network includes a first resistor connected between said control electrode of said third semiconductor and ground and a second resistor connected between said control electrode of said third semiconductor and said second power terminal.

15. The switch driver circuit of claim 13 in which said third semiconductor is an NPN transistor and said first load electrode is a collector, said second load electrode is an emitter, and said control electrode is a base.

16. The switch driver circuit of claim 1 in which said second impedance is connected to said input terminal through a semiconductor having a control electrode connected to said input terminal, a first load electrode connected to said second impedance and a second load electrode connected to said first power terminal.

17. The switch driver circuit of claim 16 in which said first load electrode of said semiconductor is connected to said second power terminal through a fourth limiting impedance.

18. The switch driver circuit of claim 16 in which said semiconductor is an NPN transistor and said first load electrode is a collector, said second load electrode is an emitter and said control electrode is a base.

19. An impedance sensitive switch driver circuit for providing an output which is approximately symmetrical about a reference voltage level in response to an input signal which swings between a first state in which the input source provides a first voltage level and appears as a lower impedance, and a second state in which the input source provides a second voltage level and appears as a higher impedance comprising:

an input terminal;

an output terminal;

a voltage divider circuit having a first power terminal and a second power terminal, and including a first impedance having one end connected to said first power terminal and the other end connected to said input terminal for producing in said second state at said input terminal a voltage approximately equal to said second voltage level, a buffer semiconductor having a control electrode connected to said input terminal, a first load electrode and a second load electrode connected to said first power terminal, a second impedance having one end connected to said first load electrode of said buffer semiconductor and the other end connected to a switching terminal for producing a voltage difference between said input terminal and said switching terminal, and a third impedance having one end connected to said switching terminal and the other end connected to said second power terminal for minimizing the change in current through said second impedance between said first and second states;

a semiconductor circuit including a first semiconductor having a first load electrode connected to said output terminal a second load electrode connected to a third power terminal and a control electrode connected to said switching terminal for turning on said first semiconductor in one of said states and a second semiconductor having a first load electrode connected to said output terminal, a second load electrode connected to a fourth power terminal and a control electrode connected to said switching terminal for turning on said second semiconductor during the other of said states.

20. An impedance sensitive switch driver circuit for providing an output which is approximately symmetrical about a reference voltage level in response to an input signal which swings between a first state in which the input source provides a first voltage level and appears as a lower impedance and a second state in which the input source provides a second voltage level and appears as a higher impedance comprising:

an input terminal;

an output terminal;

a voltage divider circuit having first power terminal and a second power terminal, and including a first impedance having one end connected to said first power terminal and the other end connected to said input terminal for producing in said second state at said input terminal a voltage approximately equal to said second voltage level, a second impedance having one end connected to said input terminal and the other end connected to a switching terminal for producing a voltage difference between said input terminal and said switching terminal, a constant current source having one end connected to said switching terminal and the other end connected to said second power terminal for keeping constant the current through said second impedance during said first and second states;

a semiconductor circuit including a first semiconductor having a first load electrode connected to said output terminal a second load electrode connected to a third power terminal and a control electrode connected to said switching terminal for turning on said first semiconductor during one of said states, and a second semiconductor having a first load electrode connected to said output terminal, a second load electrode connected to a fourth power terminal and a control electrode connected to said switching terminal for turning on said second semiconductor during the other of said states.

21. The switch driver circuit of claim 20 in which said constant current source includes a third semiconductor having a first load electrode, a second load electrode connected to said switching terminal and a control electrode connected to a biasing network for biasing said third semiconductor to conduct, and a third limiting impedance having one end connected to said second load electrode of said third semiconductor and the other end connected to said second power terminal.

22. An impedance sensitive switch driver circuit for providing an output which is approximately symmetrical about a reference voltage level in response to an input signal which swings between a first state in which the input source provides a first voltage level and appears as a lower impedance and a second state in which the input source provides a second voltage level and appears as a higher impedance comprising:

an input terminal;

an output terminal;

a voltage divider circuit having a first power terminal for connection to a positive voltage source and a second power terminal for connection to a negative voltage source and including a first impedance having one end connected to said first power terminal and the other end connected to said input terminal for producing in said second state at said input terminal a voltage approximately equal to said second voltage level, a second impedance having one end connected to said input terminal and the other end connected to a switching terminal for producing a voltage difference between said input terminal and said switching terminal, and a third impedance having one end connected to said switching terminal and the other end connected to said second power terminal for minimizing the change in current through said second impedance between said first and second states; and an NPN transistor having its emitter connected to said output terminal, its collector connected to said first power terminal, and its base connected to said switching terminal for turning on said NPN transistor during one of said states, and a PNP transistor having an emitter connected to said output terminal, a collector connected to said second power terminal and a base connected to said switching terminal for turning on said second PNP transistor during the other of said states.

* * * * *